US010992115B2

(12) United States Patent
Yin

(10) Patent No.: US 10,992,115 B2
(45) Date of Patent: Apr. 27, 2021

(54) LANDSCAPE ADVERTISING LIGHT BOX TYPE MINIATURIZED SUBSTATION

(71) Applicant: Jiangsu Huafu Electric Power Tecnology Co., Ltd., Jiangsu (CN)

(72) Inventor: Jianguo Yin, Nanjing (CN)

(73) Assignee: Jiangsu Huafu Electric Power Technology Co., Ltd., Jiangsu (CN)

( * ) Notice: Subject to any disclaimer, the term of this patent is extended or adjusted under 35 U.S.C. 154(b) by 0 days.

(21) Appl. No.: 16/679,805

(22) Filed: Nov. 11, 2019

(65) Prior Publication Data

US 2021/0091543 A1 Mar. 25, 2021

(30) Foreign Application Priority Data

Sep. 25, 2019 (CN) .......................... 201910909442.0

(51) Int. Cl.
| | |
|---|---|
| *H02B 7/06* | (2006.01) |
| *H02B 1/30* | (2006.01) |
| *H02B 1/56* | (2006.01) |
| *H02K 7/20* | (2006.01) |
| *H05K 5/00* | (2006.01) |
| *H02B 1/38* | (2006.01) |

(Continued)

(52) U.S. Cl.
CPC ............... *H02B 7/06* (2013.01); *G09F 23/00* (2013.01); *H02B 1/305* (2013.01); *H02B 1/306* (2013.01); *H02B 1/38* (2013.01); *H02B 1/565* (2013.01); *H05K 5/0017* (2013.01); *H05K 7/20172* (2013.01)

(58) Field of Classification Search
CPC .. H02B 13/055; H02B 13/035; H02B 13/045; H02B 1/28; H02B 1/48; H02B 7/01; H02B 1/26; H02B 7/06; H02B 1/306; H02B 1/565; H02B 1/38; H02B 1/305; H05K 5/0017; G09F 23/00
See application file for complete search history.

(56) References Cited

U.S. PATENT DOCUMENTS 2,397,099 A * 3/1946 Gates ...................... H01F 27/40
361/38
3,697,819 A * 10/1972 Eichelberger .......... H02B 13/02
361/603

(Continued)

FOREIGN PATENT DOCUMENTS

CN 109326981 A 2/2019

OTHER PUBLICATIONS

English translation; Chinese Publication No. CN109326981A; publication date: Feb. 12, 2019; 14 pages.

*Primary Examiner* — Adam B Dravininkas
(74) *Attorney, Agent, or Firm* — Blank Rome LLP

(57) ABSTRACT

A landscape advertising light, box type miniaturized substation, belonging to the field of substations. The landscape advertising light box type miniaturized substation includes a box body; the box body is internally provided with a ring main unit, a transformer and an integrated low-voltage cabinet; the integrated low-voltage cabinet includes an incoming switch, a capacitor switch, a capacitor and an outgoing switch which are electrically connected in sequence; an output end of the ring main unit is electrically connected with an input end of the transformer, and an output end of the transformer is electrically connected with an input end of the incoming switch; a display screen is disposed outside the box body.

10 Claims, 6 Drawing Sheets

(51) Int. Cl.
*G09F 23/00* (2006.01)
*H05K 7/20* (2006.01)

(56) References Cited

U.S. PATENT DOCUMENTS

| | | | | |
|---|---|---|---|---|
| 5,280,408 A * | 1/1994 | Izumi | ................. | H02B 7/00 |
| | | | | 361/620 |
| 6,195,253 B1 * | 2/2001 | Fahlgren | ................. | H02B 5/00 |
| | | | | 200/48 A |
| 6,233,137 B1 * | 5/2001 | Kolos | ................. | H02B 7/00 |
| | | | | 200/48 R |
| 2011/0057512 A1 * | 3/2011 | Prax | ................. | H02J 3/382 |
| | | | | 307/18 |
| 2012/0274219 A1 * | 11/2012 | Woytowitz | ........... | H05B 47/155 |
| | | | | 315/152 |
| 2015/0185791 A1 * | 7/2015 | Hall | ................. | G06F 1/183 |
| | | | | 361/679.21 |
| 2017/0338633 A1 * | 11/2017 | Gong | ................. | H02B 3/00 |
| 2018/0130388 A1 * | 5/2018 | Hall | ................. | G06F 1/188 |

* cited by examiner

LANDSCAPE ADVERTISING LIGHT BOX TYPE MINIATURIZED SUBSTATION

RELATED APPLICATION

This application claims benefit of priority of China Patent Application No. 201910909442.0, filed Sep. 25, 2019, entitled: LANDSCAPE ADVERTISING LIGHT BOX TYPE MINIATURIZED SUBSTATION. The above-identified, related application is incorporated herein by reference in its entirety.

FIELD OF USE

The present invention relates to the field of substations, in particular, to a landscape advertising light box type miniaturized substation.

BACKGROUND OF THE INVENTION

As the demand of urban residents for electricity consumption continues to grow rapidly, residents' expectations for power supply reliability are increasing, the demand for upgrading and optimization of power distribution facilities is increasing, and problems of traditional European-style box type transformers as one of urban infrastructures are becoming more and more obvious during operation. European-style box type transformers are generally disposed in main roads of cities. Currently, as shown in FIG. 6, they are generally composed of a high-voltage chamber, a transformer chamber and a low-voltage chamber which are combined; the high-voltage chamber is provided with a high-voltage incoming cabinet and high-voltage outgoing cabinet; the transformer chamber is provided with a transformer; an input end of the transformer is provided with a copper bar, and the transformer uses a plurality of heat sinks to dissipate heat; the low-voltage chamber is provided with a low-voltage incoming cabinet, a capacitor cabinet and a low-voltage outgoing cabinet; an output end of the high-voltage incoming cabinet is electrically connected with an input end of the high-voltage outgoing cabinet; an output end of the high-voltage outgoing cabinet is electrically connected with the copper bar at the input end of the transformer; an output end of the transformer is electrically connected with the input end of the low-voltage incoming cabinet; an output end of the low-voltage incoming cabinet is electrically connected with an input end of the capacitor cabinet; an output end of the capacitor cabinet is electrically connected with an input end of the low-voltage outgoing cabinet. Restricted by the size of various components, the European-style box type transformers have a large overall size and are not easy to transport; instead, they are easy to become a carrier of small advertisements, and become a visual pollution that affects the urban environment and is incompatible with the beautiful urban environment. Therefore, the traditional European-style box type transformers have not adapted to the needs of social development and urban environmental construction in city construction.

SUMMARY OF THE INVENTION

To solve the above technical problems, the present invention provides a landscape advertising light box type miniaturized substation, which is small in size, easy to transport, and can be coordinated with an urban environment.

To achieve the above purpose, the present invention provides the following technical solutions.

A landscape advertising light box type miniaturized substation includes a box body, where the box body is internally provided with a ring main unit, a transformer and an integrated low-voltage cabinet; the integrated low-voltage cabinet includes an incoming switch, a capacitor switch, a capacitor and an outgoing switch which are electrically connected in sequence; an output end of the ring main unit is electrically connected with an input end of the transformer, and an output end of the transformer is electrically connected with an input end of the incoming switch; a display screen is disposed outside the box body.

Further, the input end of the transformer is provided with a post insulator; the post insulator is electrically connected with a European-style plug; the European-style plug is electrically connected with the output end of the ring main unit through a flexible cable; a bottom end of the transformer is provided with a damper and a cooling fan.

Further, the box body includes a support frame disposed inside and a housing disposed outside the support frame; two opposite side walls of the housing are respectively provided with a front door and a rear door; an outer surface of the front door and the rear door is provided with one of the display screens.

Further, an upper edge of the front door and the rear door is movably connected with a top surface edge of the housing by a hinge, so that a worker can open the front door and the rear door respectively from a lower part of the front door and the rear door.

Further, a pneumatic strut is disposed between two sides of the front door and the rear door and a side wall of the housing; one end of the pneumatic strut is hinged to a side of the front door or the rear door, and the other end is hinged to the side wall of the housing.

Further, a manual strut is disposed between two sides of the front door and the rear door and a side wall of the housing; the manual strut includes a first strut and a second strut; one end of the first strut is hinged to the side wall of the housing, and the other end is fixedly connected with a limiting slot; two side walls of the limiting slot are oppositely provided with a pin hole; one end of the second strut is provided with a first pin, and the first pin is rotatably connected into the pin hole; the other end of the second strut is hinged to a side of the front door or the rear door, and the second strut is rotatable about the pin for 180 degrees with respect to the first strut.

Further, a fixing slot is disposed on the side wall of the housing and a side of the front door or the rear door; the fixing slot is provided with a sliding hole along a length direction of the fixing slot; an end of the first strut and an end of the second strut are respectively provided with a second pin; the second pin is inserted into the sliding hole; the first strut and the second strut are rotatable about the second pin, and the second pin is slidable along the sliding hole.

Further, an upper part of a side wall of the housing except side walls of the front door and the rear door is provided with a side vent, and a lower part of each side wall of the housing is provided with a lower vent; a top surface and a bottom surface of the housing are both provided with a fan, and the fan communicates with the inside of the housing.

Further, an inside bottom end of the box body is provided with an elevated base, and the ring main unit, the transformer and the integrated low-voltage cabinet are all supported on the elevated base.

Further, the landscape advertising light box type miniaturized substation further includes a social integrated information collection system for collecting and analyzing road vehicle traffic.

Compared with the prior art, the present invention achieves the following technical effects.

The landscape advertising light box type miniaturized substation provided by the present invention includes a box body, where the box body is internally provided with a ring main unit, a transformer and an integrated low-voltage cabinet; the integrated low-voltage cabinet includes an incoming switch, a capacitor switch, a capacitor and an outgoing switch which are electrically connected in sequence; an output end of the ring main unit is electrically connected with an input end of the transformer, and an output end of the transformer is electrically connected with an input end of the incoming switch; a display screen is disposed outside the box body. By replacing a high-voltage incoming cabinet and a high-voltage outgoing cabinet with the ring main unit, and replacing a low-voltage incoming cabinet, a low-voltage outgoing cabinet and a capacitor cabinet with the integrated low-voltage cabinet, the landscape advertising light box type miniaturized substation is greatly reduced in size, easy to transport, and with the disposition of the display screen, the substation is present as a variety of landscape modes such as advertising light boxes and artistic shapes in harmony with the surrounding environment, which not only beautifies the environment, but also brings about huge advertising revenue.

BRIEF DESCRIPTION OF THE DRAWINGS

To describe the technical solutions in the embodiments of the present invention or in the prior art more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

Figure 1:
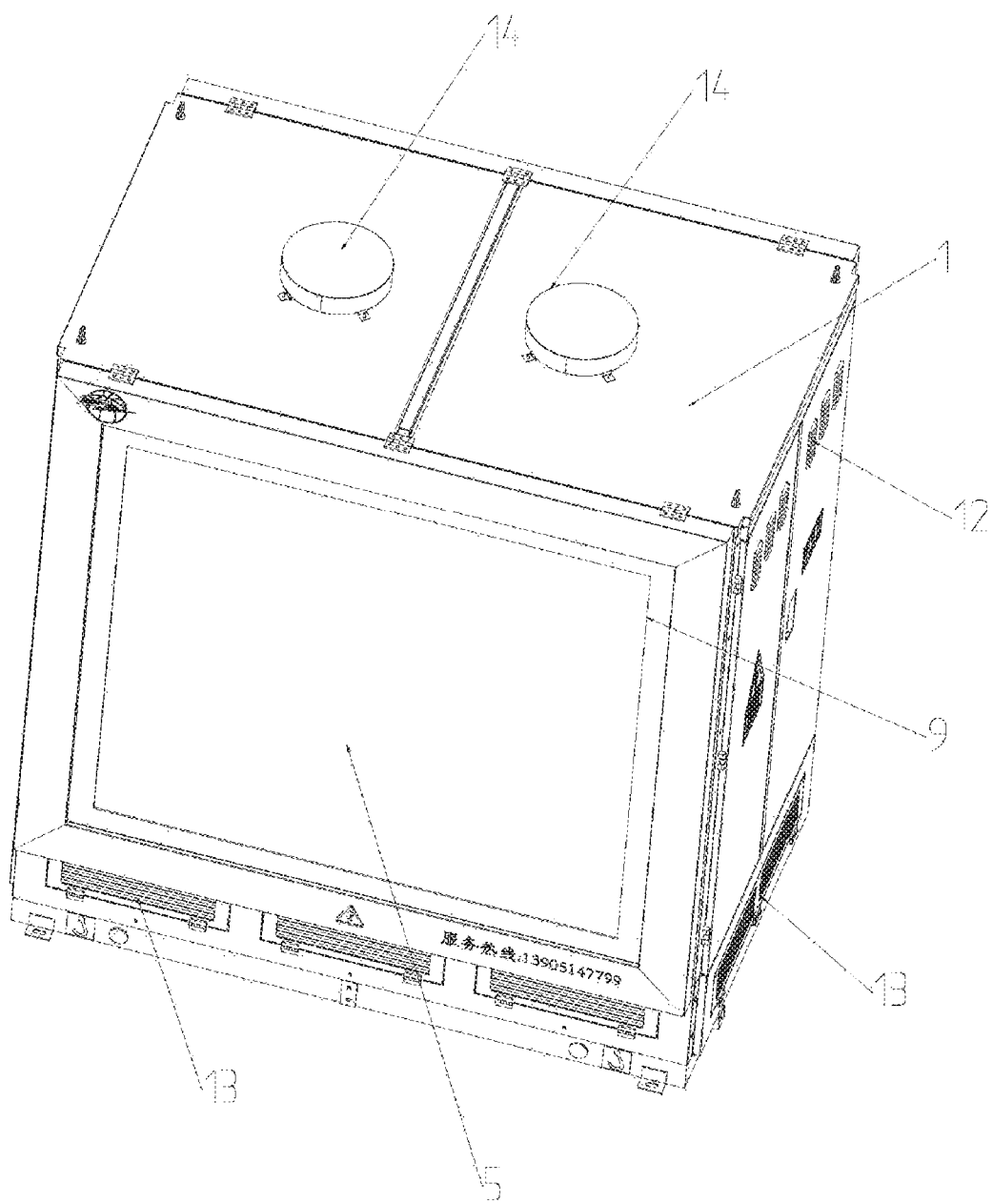
FIG. 1 is a schematic structural diagram of a landscape advertising light box type miniaturized substation provided in an embodiment of the present invention.

Description of reference numerals: 1. housing; 2. ring main unit; 3. transformer; 4. integrated low-voltage cabinet; 5. display screen; 6. manual strut; 61. first strut; 62. second strut; 63. limiting slot; 64. pin hole; 65. first pin; 66. second pin; 7. European-style plug; 8. flexible cable; 9. front door; 10. pneumatic strut; 11. post insulator; 12. side vent; 13. lower vent; 14. fan; 15. elevated base; 16. low-voltage busbar; 17. fixing slot; 18. sliding hole; 19. high-voltage chamber; 20. transformer chamber; 21. low-voltage chamber; 22. high-voltage incoming cabinet; 23. high-voltage outgoing cabinet; 24. low-voltage incoming cabinet; 25. capacitor cabinet; and 26. low-voltage outgoing cabinet.

DETAILED DESCRIPTION OF THE ILLUSTRATED EMBODIMENTS

The following clearly and completely describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 2:
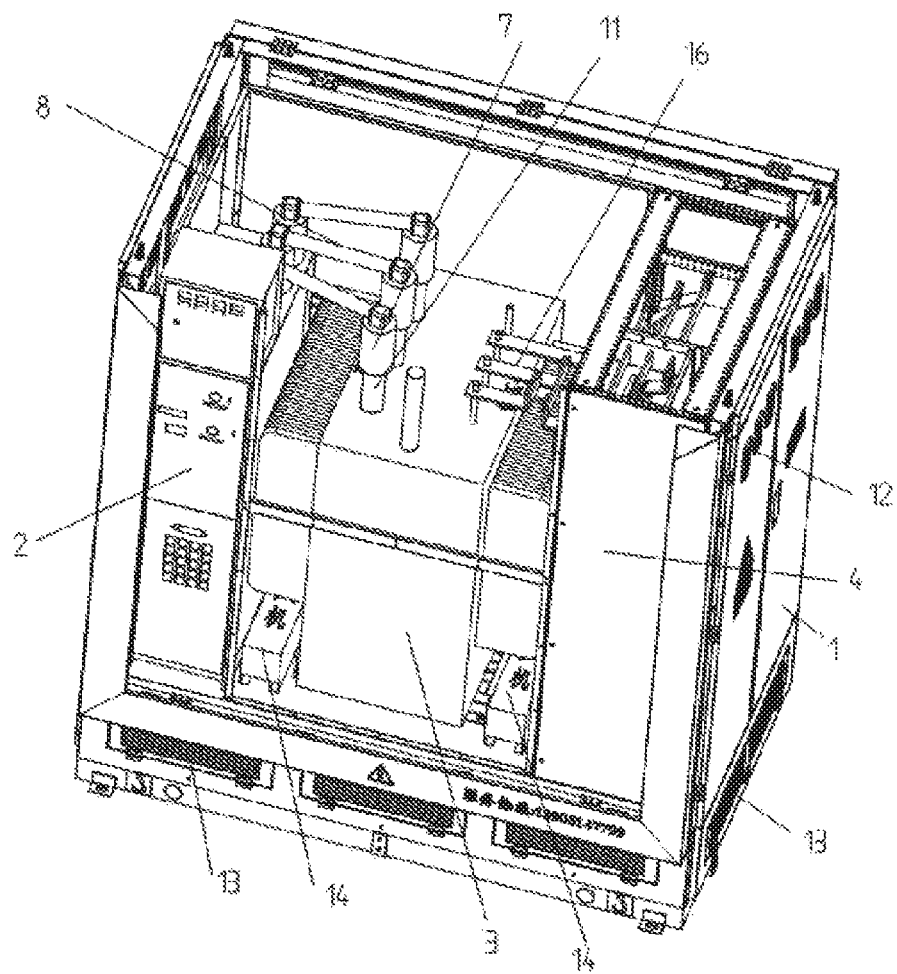
FIG. 2 is a schematic diagram of an internal structure of a landscape advertising light box type miniaturized substation provided in an embodiment of the present invention.
Figure 3:
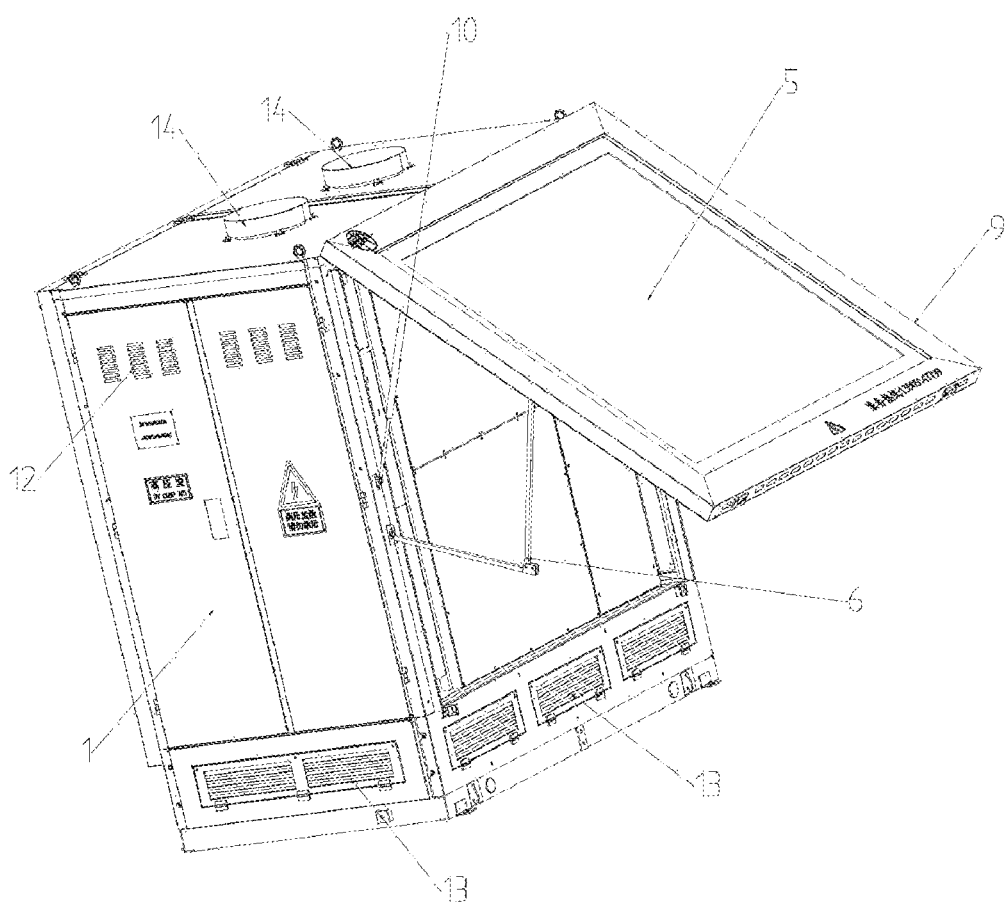
FIG. 3 is a schematic diagram showing an opening state of a front door of a landscape advertising light box type miniaturized substation provided in an embodiment of the present invention.
Figure 4:
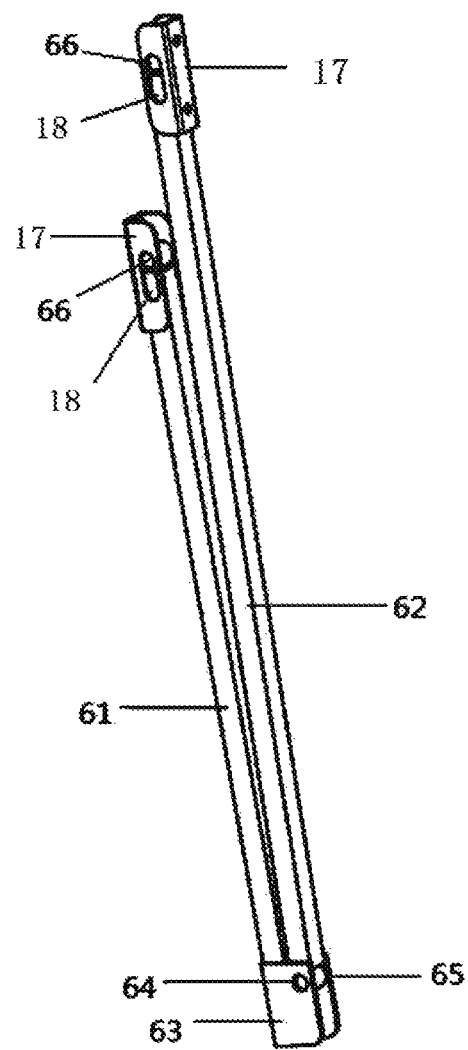
FIG. 4 is a schematic structural diagram of a manual strut of a landscape advertising light box type miniaturized substation provided in an embodiment of the present invention.
Figure 5:
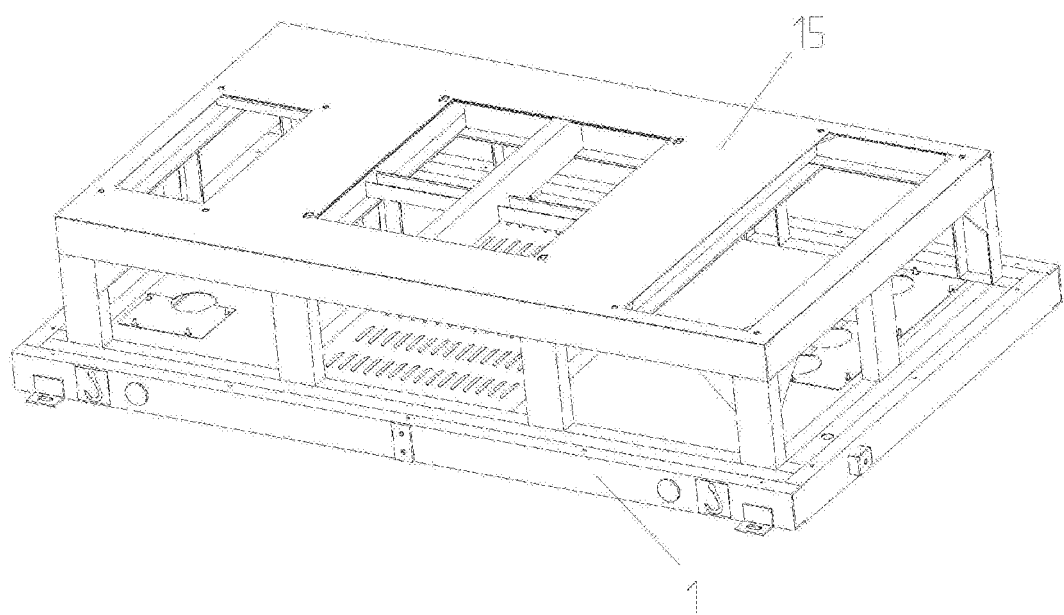
FIG. 5 is a schematic structural diagram of an elevated base of a landscape advertising light box type miniaturized substation provided in an embodiment of the present invention.
Figure 6:
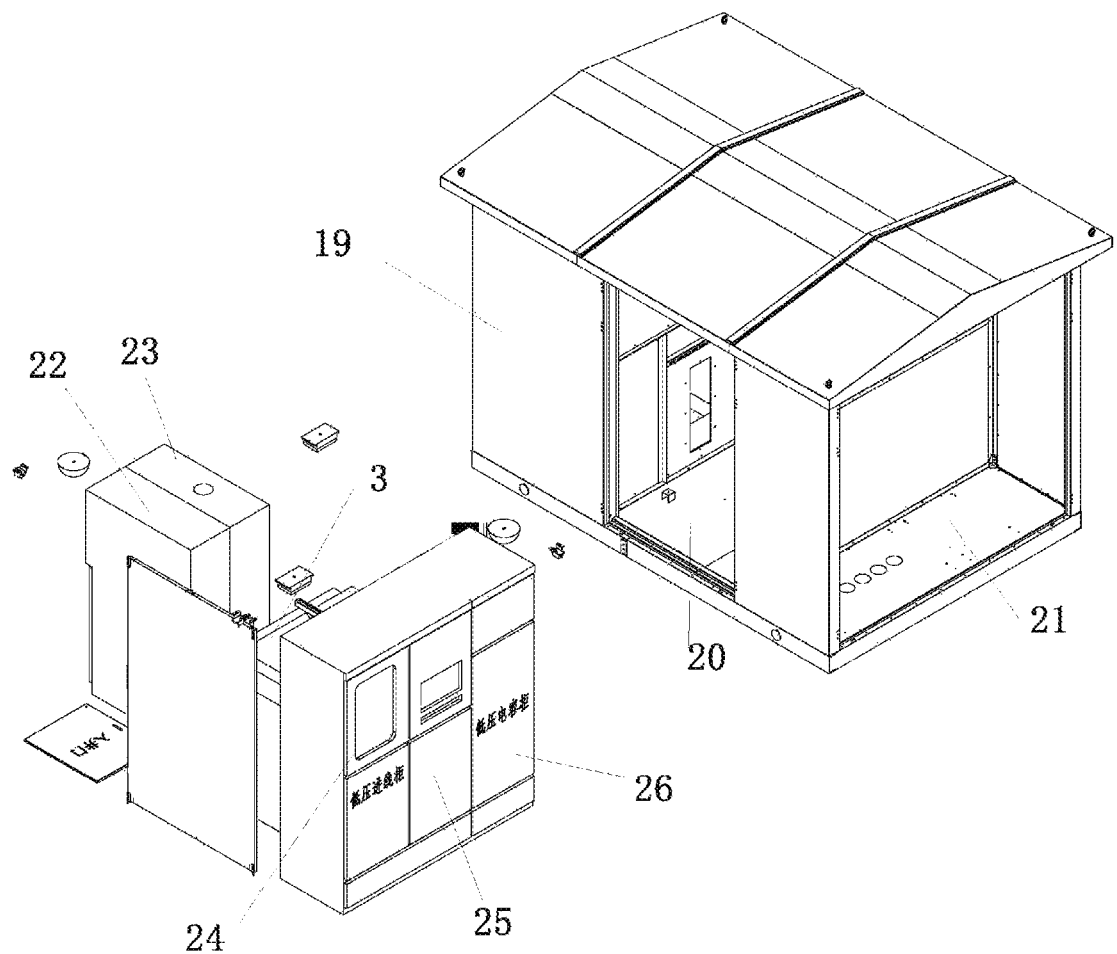
FIG. 6 is a schematic structural diagram of an exploded view of a traditional European-style box type transformer.

An embodiment provides a landscape advertising light box type miniaturized substation, as shown in FIG. 1 to FIG. 5. The landscape advertising light box type miniaturized substation includes a box body, where the box body is internally provided with a ring main unit 2, a transformer 3 and an integrated low-voltage cabinet 4; the integrated low-voltage cabinet 4 includes an incoming switch, a capacitor switch, a capacitor and an outgoing switch which are electrically connected in sequence; an output end of the ring main unit 2 is electrically connected with an input end of the transformer 3, and an output end of the transformer 3 is electrically connected with an input end of the incoming switch; a display screen 5 is disposed outside the box body. The landscape advertising light box type miniaturized substation replaces a high-voltage cabinet with the ring main unit 2; the ring main unit 2 integrates a grounding switch, a fuse barrel, a composite switch, a microcomputer protector and a circuit breaker, and replaces a high-voltage incoming cabinet 22 and a high-voltage outgoing cabinet 23; thus, one cabinet can realize the functions of incoming, outgoing, and transformer 3 trip for overtemperature, overcurrent and mistaken entrance into a charged interval; the integrated low-voltage cabinet 4 replaces a low-voltage cabinet, and integrates a low-voltage incoming cabinet 24, a low-voltage outgoing cabinet 26 and a capacitor cabinet 25; in this way, the device has a compact overall structure, reasonable layout, greatly reduced volume, and easy transportation, and with the disposition of the display screen 5, the substation is present as a variety of landscape modes such as advertising light boxes and artistic shapes in harmony with the surrounding environment, which not only beautifies the environment, but also brings about huge advertising revenue.

In a specific process of use, the display screen 5 is connected with an output end of the outgoing switch, and after the display screen 5 is turned on, the display screen 5 can display an advertisement and an artistic picture suitable for the surrounding environment.

In this embodiment, specifically, the ring main unit 2 is a fully insulated fully sealed inflatable cabinet, and the box body is a cuboid box body, including a support frame disposed inside and a housing 1 disposed outside the support frame.

Further, the input end of the transformer 3 is provided with a post insulator 11; the post insulator 11 is electrically connected with a European-style plug 7; the European-style plug 7 is electrically connected with the output end of the ring main unit 2 through a flexible cable 8. An existing copper bar connection method is extremely demanding on a safety distance and a protection level, and has a complicated structure, and large space; the volume of the device is further reduced by replacing the copper bar with the post insulator 11.

Further, a bottom end of the transformer 3 is provided with a cooling fan, and the cooling fan takes up less space than heat dissipation by using a plurality of heat sinks, so that the volume of the device is smaller. In a specific process of use, the heat dissipation by a main body of the transformer 3 is converted into heat dissipation by forced air cooling, which greatly improves the stability, and can effectively control the temperature of the transformer 3, thereby ensuring the normal operation of the device.

Further, the bottom end of the transformer 3 is provided with a damper. By the damper, the smooth performance of the transformer 3 is greatly improved.

Further, two opposite side walls of the housing 1 are respectively provided with a front door 9 and a rear door, and a display screen 5 is disposed on the outer surface of the front door 9 and the rear door. By disposing the front door 9 and the rear door, the device is easy to disassemble and repair.

Further, an upper edge of the front door 9 and the rear door is movably connected with a top surface edge of the housing 1 by a hinge, so that a worker can open the front door 9 and the rear door respectively from a lower part of the front door 9 and the rear door. With this disposition, the front door 9 and the rear door are easy to open and close.

Further, a pneumatic strut 10 is disposed between two sides of the front door 9 and the rear door and a side wall of the housing 1; one end of the pneumatic strut 10 is hinged to the a side of the front door 9 or the rear door, and the other end is hinged to the side wall of the housing 1. The pneumatic strut 10 plays a buffering role in the process of opening/closing the front door 9 and the rear door, avoiding an impact from opening/closing in place, and the whole process is safe and labor-saving.

Further, a manual strut 6 is disposed between two sides of the front door 9 and the rear door and a side wall of the housing 1; the manual strut 6 includes a first strut 61 and a second strut 62; one end of the first strut 61 is hinged to the side wall of the housing 1, and the other end is fixedly connected with a limiting slot 63; two side walls of the limiting slot 63 are oppositely provided with a pin hole 64; one end of the second strut 62 is provided with a first pin 65, and the first pin 65 is rotatably connected into the pin hole 64; the other end of the second strut 62 is hinged to a side of the front door 9 or the rear door, and the second strut 62 is rotatable about the pin for 180 degrees with respect to the first strut 61. The limiting slot 63 is slotted in a direction consistent with the first strut 61; when the second strut 62 is rotated about the first pin 65 for 180° with the first strut 61, the bottom of the limiting slot 63 is in contact with the second strut 62, thereby restricting the second strut 62 from continuing to rotate; at this time, the front door 9 or the rear door is already in a fully open state, and the first strut 61 and the second strut 62 are combined into a straight strut for support.

Further, a fixing slot 17 is disposed on the side wall of the housing 1 and a side of the front door 9 or the rear door; the fixing slot 17 is provided with a sliding hole 18 along a length direction of the fixing slot 17; an end of the first strut 61 and an end of the second strut 62 are respectively provided with a second pin 66; the second pin 66 is inserted into the sliding hole 18; the first strut 61 and the second strut 62 are rotatable about the second pin 66, and the second pin 66 is slidable along the sliding hole 18.

Further, an upper part of a side wall of the housing 1 except side walls of the front door 9 and the rear door is provided with a side vent 12, and a lower part of each side wall of the housing 1 is provided with a lower vent 13; a top surface and a bottom surface of the housing 1 are both provided with a fan 14, and the fan 14 communicates with the inside of the housing 1. The side vent 12 cooperates with the lower vent 13 to achieve natural air convection inside the housing 1, and after the fan 14 is opened, the inside and outside of the housing 1 can be forced to ventilate. In addition, in this embodiment, the number of the fans 14 disposed on the bottom surface of the housing 1 is specifically 2, and the two fans 14 are symmetrically disposed on both sides of the bottom of the transformer 3. Thus, the transformer 3 has a good cooling effect and a long service life.

Further, an inside bottom end of the box body is provided with an elevated base 15, and the ring main unit 2, the transformer 3 and the integrated low-voltage cabinet 4 are all supported on the elevated base 15. In this embodiment, the height of the elevated base 15 is specifically 400 mm. With the disposition of the elevated base 15, the height of the ring main unit 2, the transformer 3 and the integrated low-voltage cabinet 4 is increased, preventing power distribution equipment from being damaged by flood that flows over the bottom end of the box body in a rainy season.

Further, the output end of the transformer 3 is electrically connected with the input end of the incoming switch through a low-voltage busbar 16, and the low-voltage busbar 16 is fully enclosed to improve the safety of the device.

The landscape advertising light box type miniaturized substation further includes a social integrated information collection system for collecting and analyzing road vehicle traffic. By disposing the social integrated information collection system, the landscape advertising light box type miniaturized substation has diversified functions.

Several examples are used for illustration of the principles and implementation methods of the present invention. The description of the embodiments is used to help illustrate the method and its core principles of the present invention. In addition, those skilled in the art can make various modifications in terms of specific embodiments and scope of application in accordance with the teachings of the present invention. In conclusion, the content of this specification shall not be construed as a limitation to the present invention.

What is claimed is:

1. A landscape advertising light box type miniaturized substation, comprising a box body, wherein the box body is internally provided with a ring main unit, a transformer and an integrated low-voltage cabinet; the integrated low-voltage cabinet comprises an incoming switch, a capacitor switch, a capacitor and an outgoing switch which are electrically connected in sequence; an output end of the ring main unit is electrically connected with an input end of the transformer, and an output end of the transformer is electrically connected with an input end of the incoming switch; a display screen is disposed outside the box body.

2. The landscape advertising light box type miniaturized substation according to claim 1, wherein the input end of the transformer is provided with a post insulator; the post insulator is electrically connected with a European-style plug; the European-style plug is electrically connected with the output end of the ring main unit through a flexible cable; a bottom end of the transformer is provided with a damper and a cooling fan.

3. The landscape advertising light box type miniaturized substation according to claim 1, wherein the box body comprises a support frame disposed inside and a housing disposed outside the support frame; two opposite side walls of the housing are respectively provided with a front door and a rear door; an outer surface of the front door and the rear door is provided with the display screen.

4. The landscape advertising light box type miniaturized substation according to claim 3, wherein an upper edge of the front door and the rear door is movably connected with a top surface edge of the housing by a hinge, so that a worker can open the front door and the rear door respectively from a lower part of the front door and the rear door.

5. The landscape advertising light box type miniaturized substation according to claim 3, wherein a pneumatic strut is disposed between two sides of the front door and the rear door and a side wall of the housing; one end of the pneumatic strut is hinged to a side of the front door or the rear door, and the other end is hinged to the side wall of the housing.

6. The landscape advertising light box type miniaturized substation according to claim 3, wherein a manual strut is disposed between two sides of the front door and the rear door and a side wall of the housing; the manual strut comprises a first strut and a second strut; one end of the first strut is hinged to the side wall of the housing, and the other end is fixedly connected with a limiting slot; two side walls of the limiting slot are oppositely provided with a pin hole; one end of the second strut is provided with a first pin, and the first pin is rotatably connected into the pin hole; the other end of the second strut is hinged to a side of the front door or the rear door, and the second strut is rotatable about the pin for 180 degrees with respect to the first strut.

7. The landscape advertising light box type miniaturized substation according to claim 6, wherein a fixing slot is disposed on the side wall of the housing and a side of the front door or the rear door; the fixing slot is provided with a sliding hole along a length direction of the fixing slot; an end of the first strut and an end of the second strut are respectively provided with a second pin; the second pin is inserted into the sliding hole; the first strut and the second strut are rotatable about the second pin, and the second pin is slidable along the sliding hole.

8. The landscape advertising light box type miniaturized substation according to claim 3, wherein an upper part of a side wall of the housing except side walls of the front door and the rear door is provided with a side vent, and a lower part of each side wall of the housing is provided with a lower vent; a top surface and a bottom surface of the housing are both provided with a fan, and the fan communicates with the inside of the housing.

9. The landscape advertising light box type miniaturized substation according to claim 1, wherein an inside bottom end of the box body is provided with an elevated base, and the ring main unit, the transformer and the integrated low-voltage cabinet are all supported on the elevated base.

10. The landscape advertising light box type miniaturized substation according to claim 1, further comprising a social integrated information collection system for collecting and analyzing road vehicle traffic.

* * * * *